US012713592B2

(12) United States Patent
Jung et al.

(10) Patent No.: US 12,713,592 B2
(45) Date of Patent: Aug. 18, 2026

(54) SEMICONDUCTOR DEVICE AND METHOD OF FABRICATING THE SAME

(71) Applicant: Samsung Electronics Co., Ltd., Suwon-si (KR)

(72) Inventors: Hyeonok Jung, Daejeon (KR); Hyojin Park, Seoul (KR); Hojin Sung, Suwon-si (KR); Ji-Eun Lee, Suwon-si (KR); Young-Seung Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 650 days.

(21) Appl. No.: 17/819,295

(22) Filed: Aug. 11, 2022

(65) Prior Publication Data

US 2023/0209814 A1 Jun. 29, 2023

(30) Foreign Application Priority Data

Dec. 24, 2021 (KR) ........................ 10-2021-0187727

(51) Int. Cl.
*H10B 12/00* (2023.01)
*H10W 10/00* (2026.01)
*H10W 10/17* (2026.01)

(52) U.S. Cl.
CPC ............ *H10B 12/50* (2023.02); *H10B 12/01* (2023.02); *H10W 10/0145* (2026.01); *H10W 10/17* (2026.01); *H10B 12/315* (2023.02)

(58) Field of Classification Search
CPC .... H10B 12/50; H10B 12/01; H01L 21/76232
See application file for complete search history.

(56) References Cited

U.S. PATENT DOCUMENTS

| | | | | |
|---|---|---|---|---|
| 8,906,763 | B2 | 12/2014 | Park et al. | |
| 9,478,548 | B2 * | 10/2016 | Lee | H10B 12/315 |
| 9,985,035 | B1 | 5/2018 | Feng et al. | |
| 10,083,968 | B1 | 9/2018 | Nagai | |
| 10,084,051 | B2 * | 9/2018 | Park | H10D 62/115 |
| 10,355,100 | B1 * | 7/2019 | Ueda | H10D 64/693 |
| 10,784,266 | B2 | 9/2020 | Kim et al. | |
| 2007/0111467 | A1 | 5/2007 | Kim | |
| 2007/0114633 | A1 | 5/2007 | Sandhu et al. | |

(Continued)

FOREIGN PATENT DOCUMENTS

| | | | |
|---|---|---|---|
| KR | 100672120 | B1 | 1/2007 |
| KR | 100801308 | B1 | 2/2008 |

(Continued)

*Primary Examiner* — Edward Chin

(74) *Attorney, Agent, or Firm* — Wolf, Greenfield & Sacks, P.C.

(57) ABSTRACT

A semiconductor device includes a substrate having a peripheral region and a cell region therein. A first semiconductor active pattern is provided, which protrudes from the substrate in the peripheral region. A second semiconductor active pattern is provided, which protrudes from the substrate in the cell region. A first edge of an upper portion of the first semiconductor active pattern has a rounded shape, and a second edge of an upper portion of the second semiconductor active pattern has a rounded shape. A curvature of the first edge is greater than a curvature of the second edge.

18 Claims, 18 Drawing Sheets

(56) References Cited

U.S. PATENT DOCUMENTS

2013/0328160 A1* 12/2013 Ota ...................... H10B 12/488
257/506
2014/0346591 A1 11/2014 Ryu
2015/0004774 A1* 1/2015 Kang .................. H10B 12/053
438/430
2017/0154991 A1* 6/2017 Ko ..................... H10D 84/0193
2021/0118886 A1 4/2021 Choi et al.
2022/0399447 A1* 12/2022 Akaiwa ............. H10D 30/0212

FOREIGN PATENT DOCUMENTS

KR 20140137222 A 12/2014
WO WO-2022265685 A1 * 12/2022 .......... H10W 20/038

* cited by examiner

Figure 2:
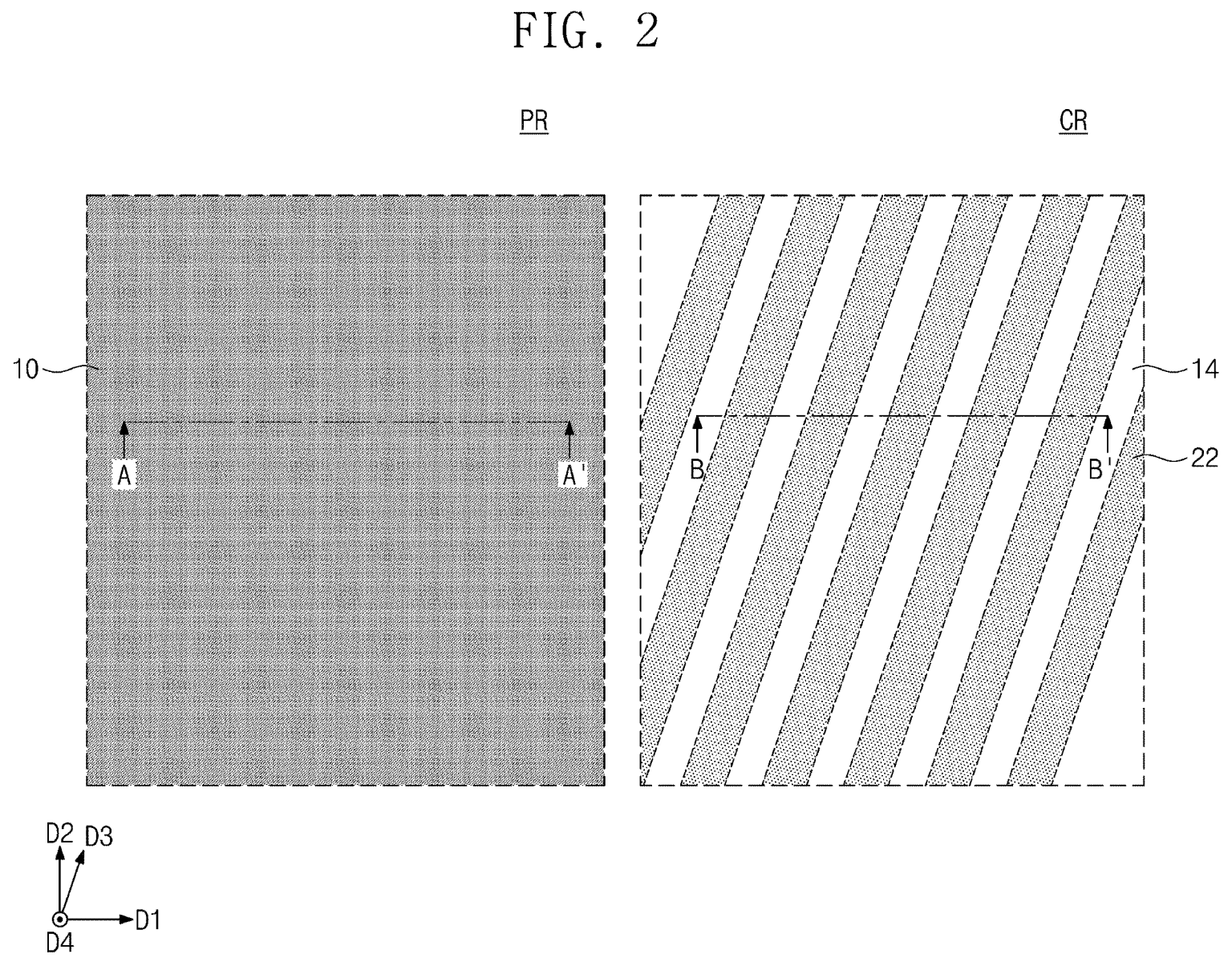

A'
A
CPLG
400a
AP(AP1)

D1
D2
D3
D4

500
420a
CPLG
342a
400a
353a
370
352a
351a
355
330a
331a
310a
305
P5
GS
RE1
AP1
10
A
A'
111
STI1
SM
D4
D1
D2
BE
DL
TE
CA
420b
400b
353b
352b
351b
350
341b
330b
331b
310b
BL
306
314
315
RE3
STI2
RE2
AP2
B
B'
113
112
LP
BC
DC
SS1
SS2
342a
360
AG
325
321
SP

SEMICONDUCTOR DEVICE AND METHOD OF FABRICATING THE SAME

REFERENCE TO PRIORITY APPLICATION

This U.S. non-provisional patent application claims priority under 35 U.S.C. § 119 to Korean Patent Application No. 10-2021-0187727, filed Dec. 24, 2021, the disclosure of which is hereby in incorporated herein by reference.

BACKGROUND

The present disclosure relates to integrated circuit devices and methods of fabricating the same and, in particular, to semiconductor switching devices having reduced susceptibility to field-induced deterioration of electrical characteristics and methods of fabricating same.

Due to their small-sized, multifunctional, and/or low-cost characteristics, semiconductor devices are considered as important elements in the electronics industry. As will be understood by those skilled in the art, semiconductor devices may be broadly classified into semiconductor memory devices for storing data, semiconductor logic devices for processing data, and hybrid semiconductor devices having both of memory and logic elements therein.

With the recent trend of higher speed and lower power consumption of electronic devices, semiconductor devices therein have also required higher operating speeds and/or lower operating voltages. In order to satisfy this requirement, it has often been necessary to increase the integration densities of semiconductor devices. However, as integration densities of semiconductor devices increases, the reliability of semiconductor devices may deteriorate and a production yield of semiconductor devices may be reduced to unacceptable levels. Accordingly, many studies are now being conducted on how to improve the reliability and production yield of semiconductor devices.

SUMMARY

An embodiment of the inventive concept provides semiconductor devices with improved reliability.

Another embodiment of the inventive concept provides methods of fabricating semiconductor devices with high yield.

According to a further embodiment of the inventive concept, a semiconductor device may include a substrate having a peripheral region and a cell region therein, and an active pattern protruding from the substrate. The active pattern may include a first active pattern on the peripheral region and a second active pattern on the cell region. A first edge of an upper portion of the first active pattern and a second edge of an upper portion of the second active pattern may have rounded shapes. Advantageously, a curvature of the first edge may be greater than a curvature of the second edge, in order to improve device performance and yield.

According to an embodiment of the inventive concept, a semiconductor device may include a substrate including a peripheral region, an active pattern protruding from the substrate, on the peripheral region, a device isolation pattern provided between the active pattern and another active pattern adjacent thereto, and a gate dielectric pattern extended along a top surface of the active pattern and a top surface of the device isolation pattern. An edge of an upper portion of the active pattern may have a rounded shape, and the top surface of the device isolation pattern may be located at a height that is substantially equal to or lower than the top surface of the active pattern. A bottom surface of the gate dielectric pattern may have a rounded shape corresponding to the edge of the upper portion of the active pattern.

According to another embodiment of the inventive concept, a method of fabricating a semiconductor device may include sequentially forming a lower mask layer and an upper mask layer on a substrate having a peripheral region and a cell region therein, and forming a first mask pattern and a second mask pattern, which are respectively placed on the peripheral region and the cell region, on the upper mask layer. A portion of the upper mask layer, which is exposed by the second mask pattern, is then removed from the cell region. Thereafter, the first mask pattern is removed from the peripheral region. An upper mask pattern is then formed by etching a remaining portion of the upper mask layer on the cell region and the peripheral region using the second mask pattern as an etch mask. The upper mask pattern may cover the lower mask layer on the peripheral region and may expose a portion of the lower mask layer on the cell region.

BRIEF DESCRIPTION OF THE DRAWINGS

FIGS. 2 to 12 are diagrams illustrating a method of fabricating a semiconductor device according to an embodiment of the inventive concept, where: FIGS. 2 and 8 are plan views illustrating a peripheral region and a cell region of FIG. 1, FIGS. 3 to 7 are sectional views taken along lines A-A' and B-B' of FIG. 2, and FIGS. 9 to 12 are sectional views taken along lines A-A' and B-B' of FIG. 8.

FIG. 16 is a plan view illustrating a semiconductor device according to an embodiment of the inventive concept.

DETAILED DESCRIPTION

Example embodiments of the inventive concepts will now be described more fully with reference to the accompanying drawings, in which example embodiments are shown.

Figure 1:
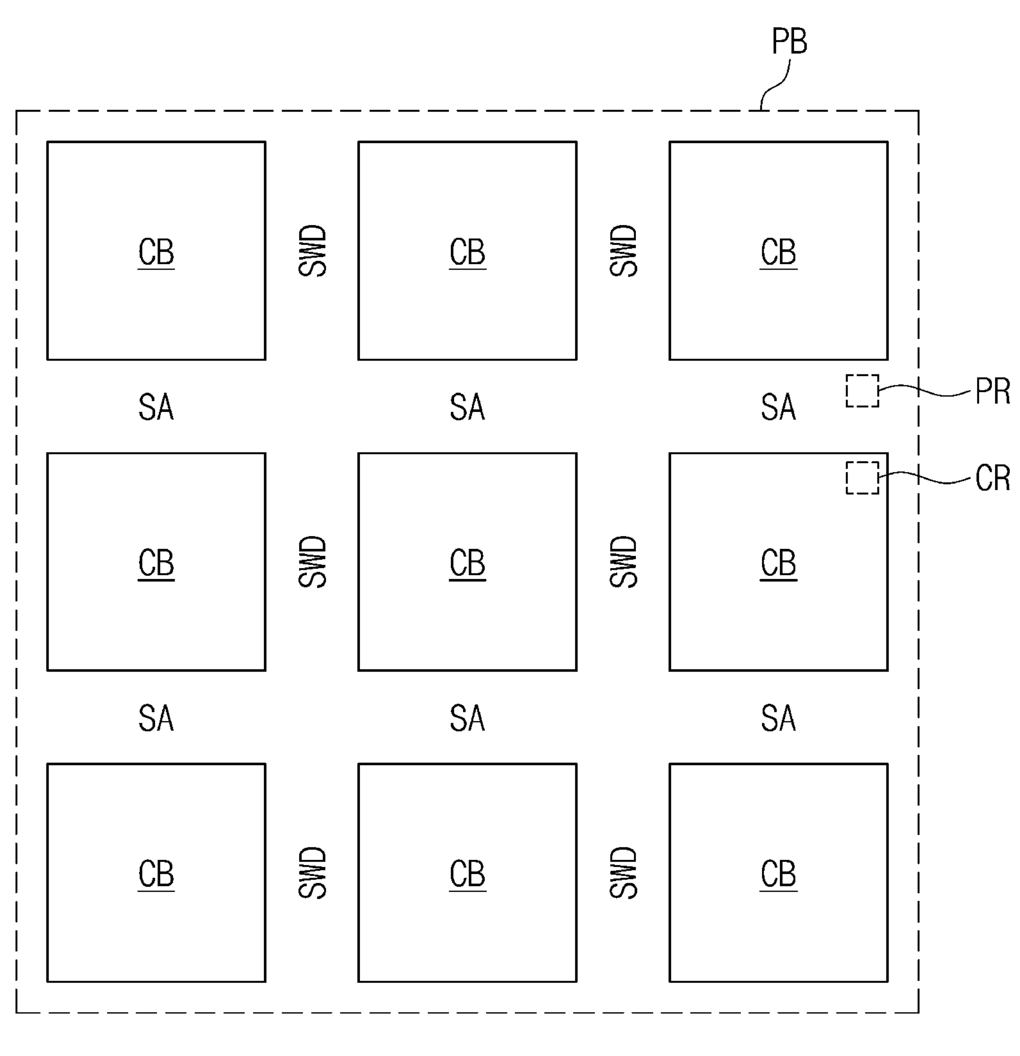
FIG. 1 is a block diagram illustrating a plan layout view of a semiconductor device according to an embodiment of the inventive concept.
Figure 1:
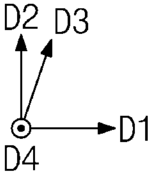

FIG. 1 is a block diagram illustrating a layout of a semiconductor device according to an embodiment of the inventive concept. Referring to FIG. 1, a semiconductor device may include cell blocks CB and a peripheral block PB, which is provided to surround each of the cell blocks CB. The semiconductor device may be a memory device, and each of the cell blocks CB may include a cell circuit (e.g., a memory integrated circuit). The cell blocks CB may be spaced apart from each other in a first direction D1 and a second direction D2, which are orthogonal to each other, for example.

The peripheral block PB may include various peripheral circuits, which are used to operate the cell circuit, and the peripheral circuits may be electrically connected to the cell circuit. The peripheral block PB may include sense amplifier circuits SA and sub-word line driver circuits SWD. In an embodiment, the sense amplifier circuits SA may be provided to face each other with the cell blocks CB interposed therebetween, and the sub-word line driver circuits SWD may be provided to face each other with the cell blocks CB interposed therebetween. The peripheral block PB may further include power and ground circuits for driving a sense amplifier, but the inventive concept is not limited to this example.

Figure 6:
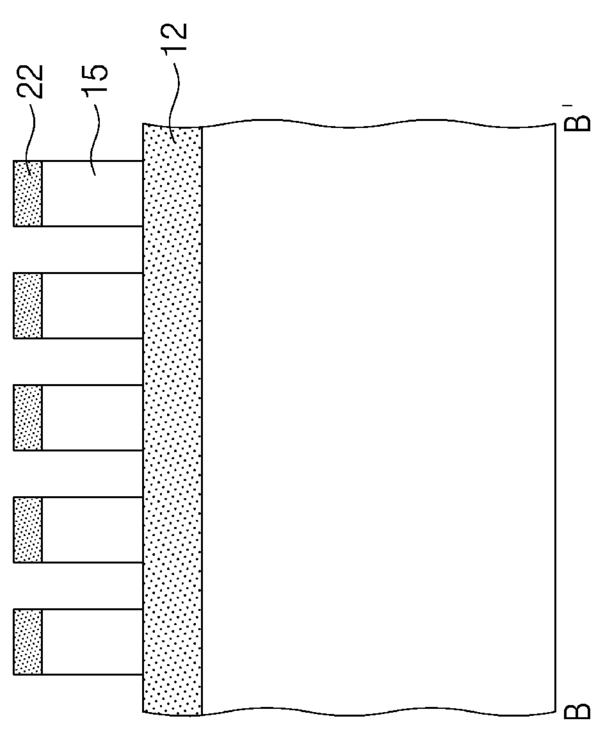
Figure 6:
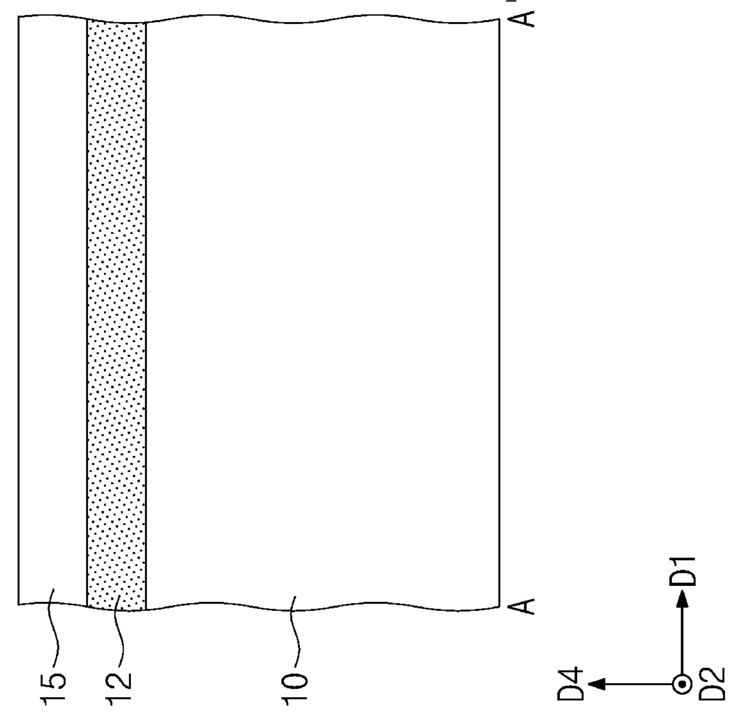
Figure 7:
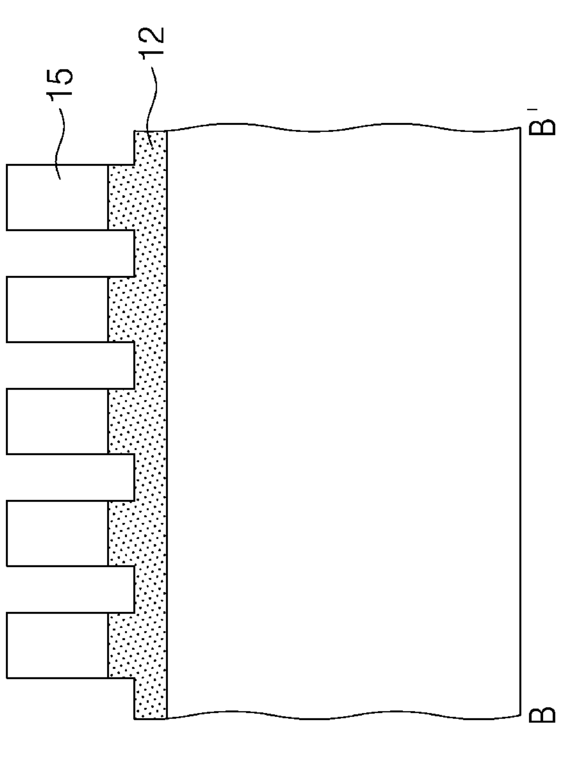
Figure 7:
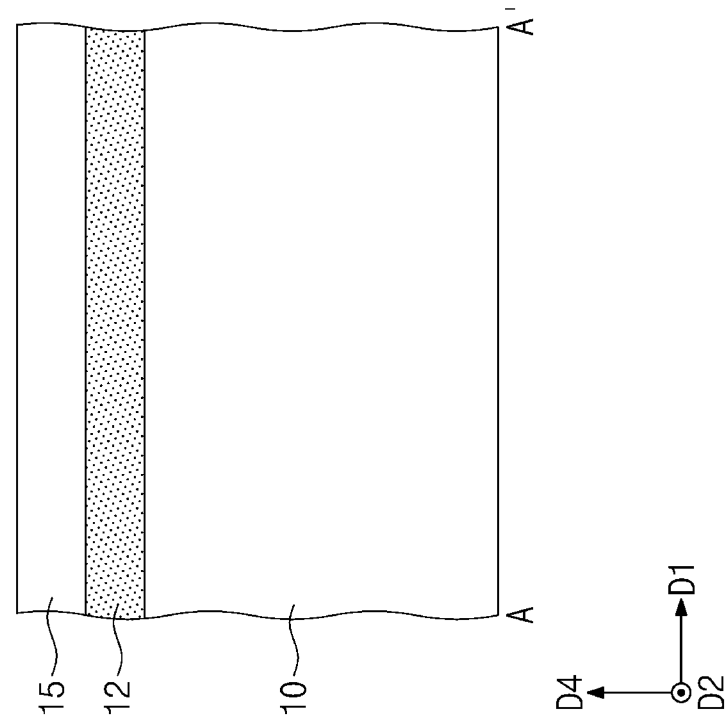
Figure 8:
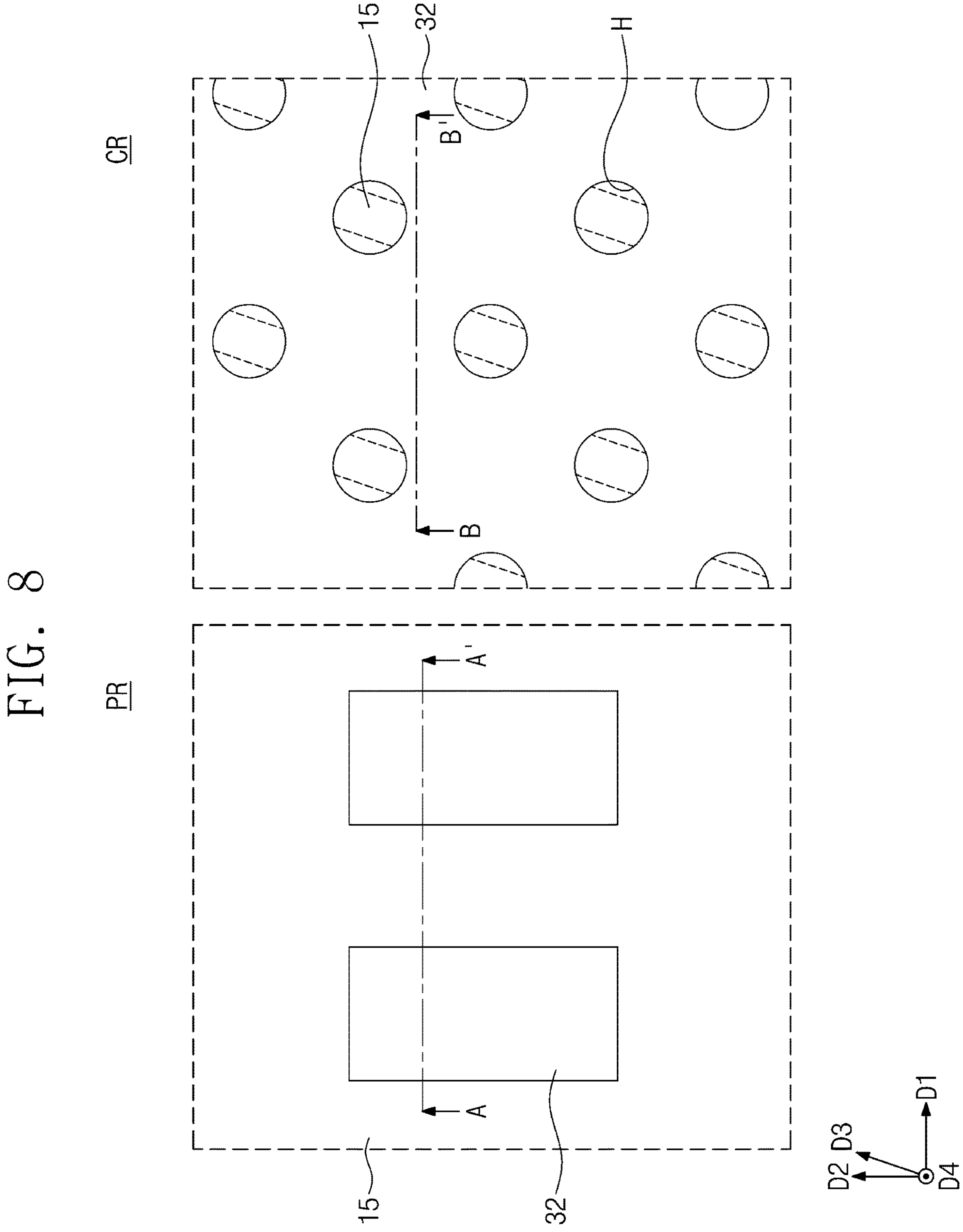
Figure 13:
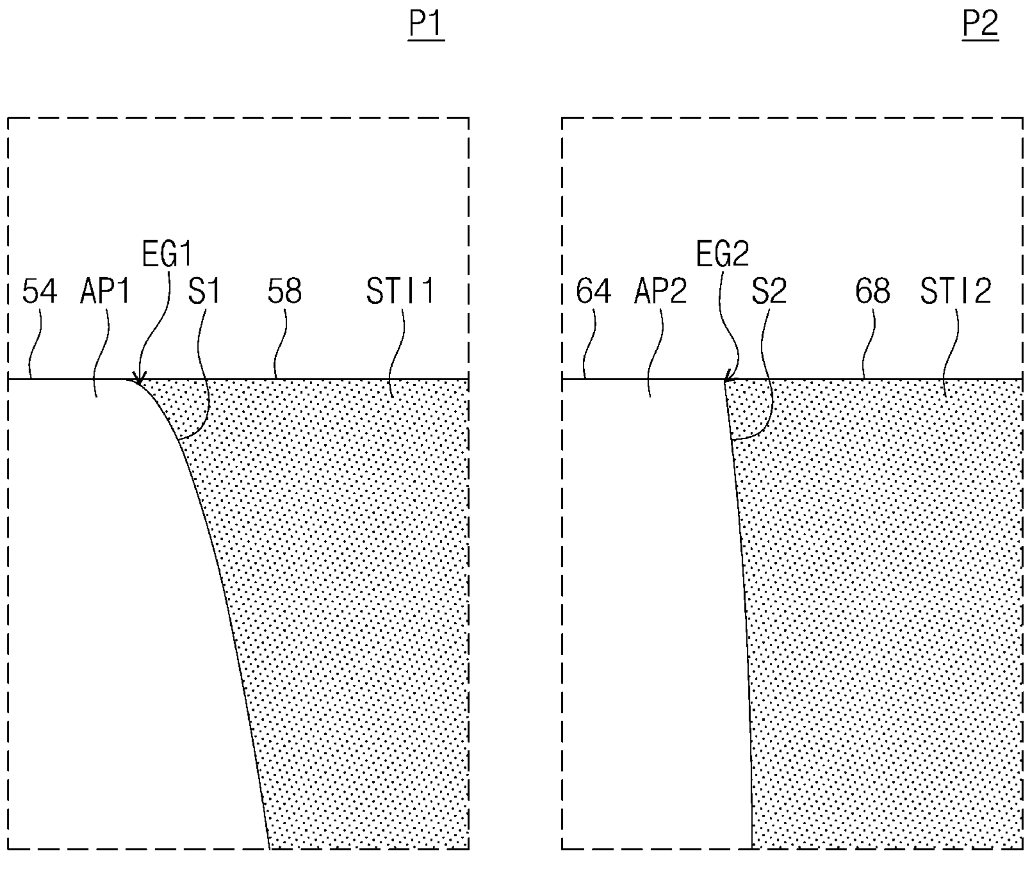
FIGS. 13 and 14 are enlarged sectional views illustrating portions P1 and P2 of FIG. 12.
Figure 14:
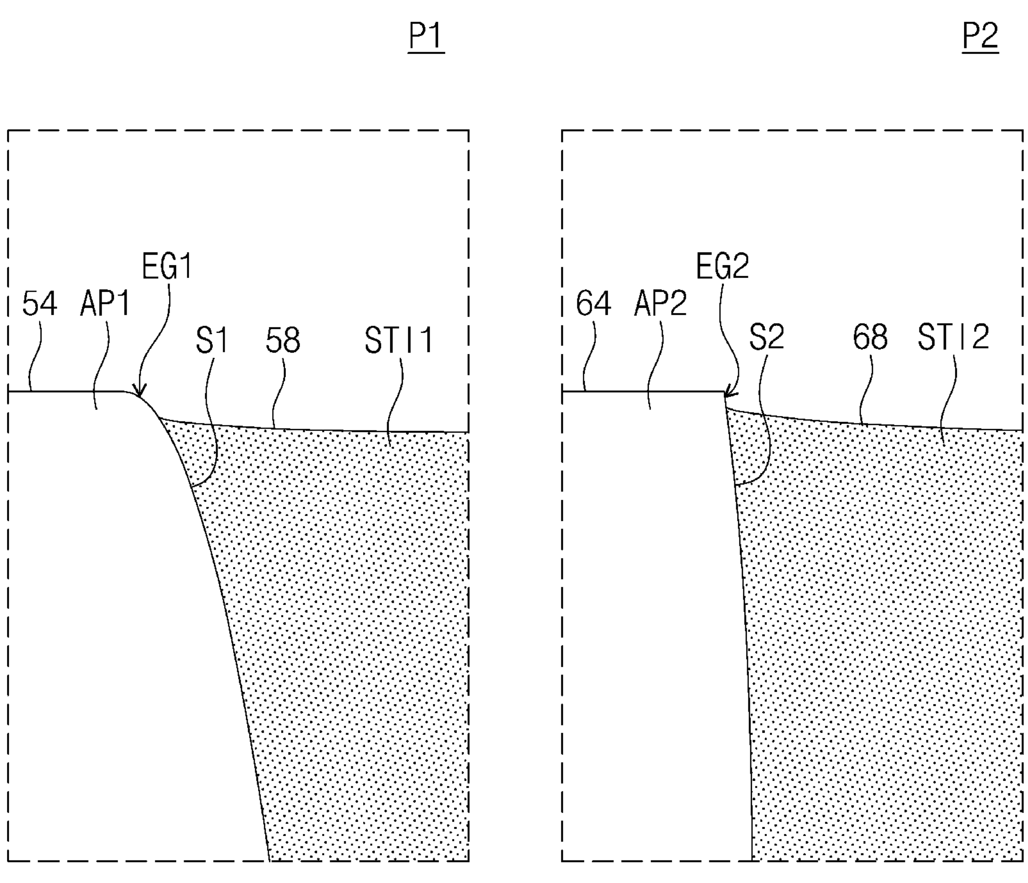
Figure 15:
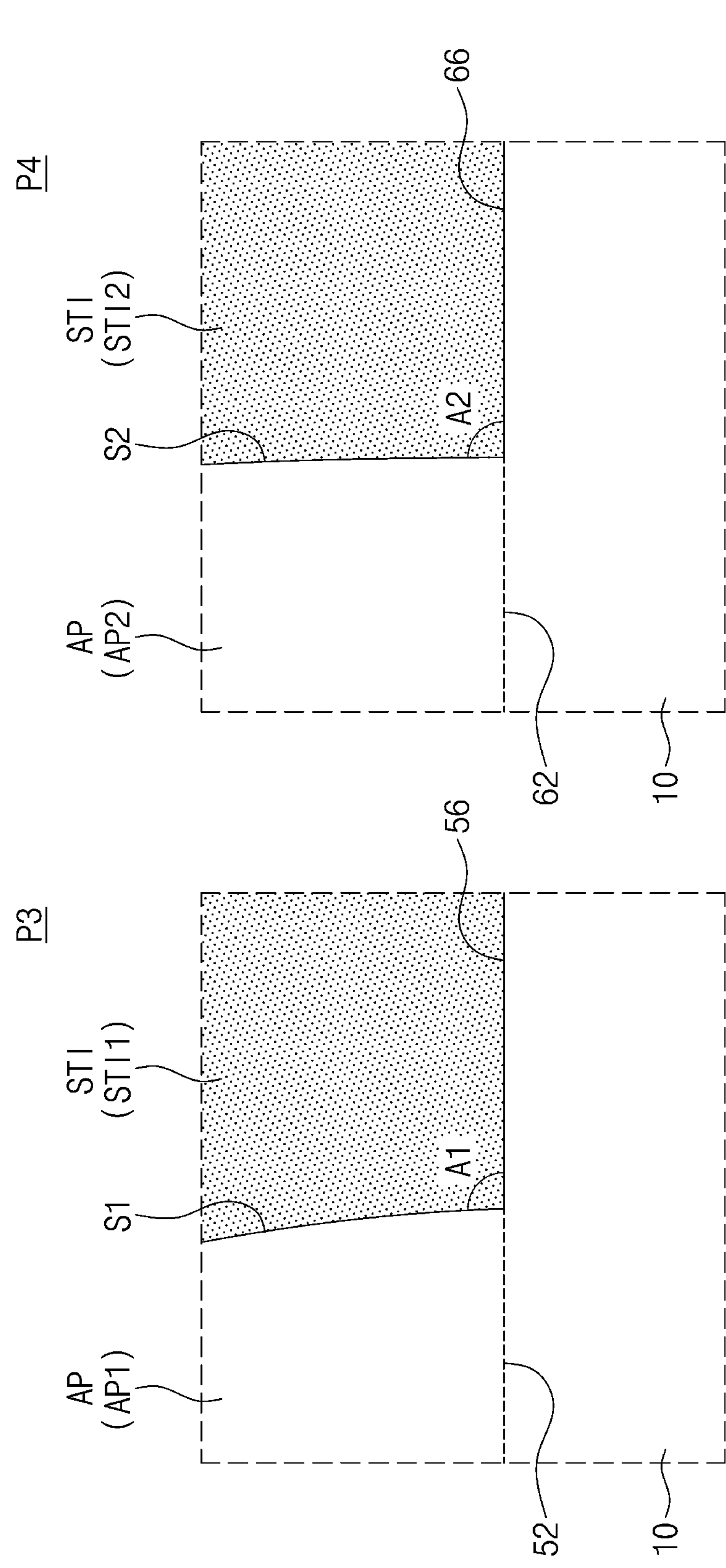
FIG. 15 is an enlarged sectional view illustrating portions P3 and P4 of FIG. 12.

FIGS. 2 to 12 are diagrams, including intermediate structures, which illustrate a method of fabricating a semiconductor device according to an embodiment of the inventive concept. In particular, FIGS. 2 and 8 are plan layout views that illustrate a peripheral region and a cell region of FIG. 1, whereas FIGS. 3 to 7 are cross-sectional views of intermediate structures taken along lines A-A' and B-B' of FIG. 2, and FIGS. 9 to 12 are cross-sectional views of intermediate structures taken along lines A-A' and B-B' of FIG. 8. In addition, FIGS. 13 and 14 are enlarged sectional views illustrating portions P1 and P2 of FIG. 12, whereas FIG. 15 is an enlarged sectional view illustrating portions P3 and P4 of FIG. 12.

Figure 3:
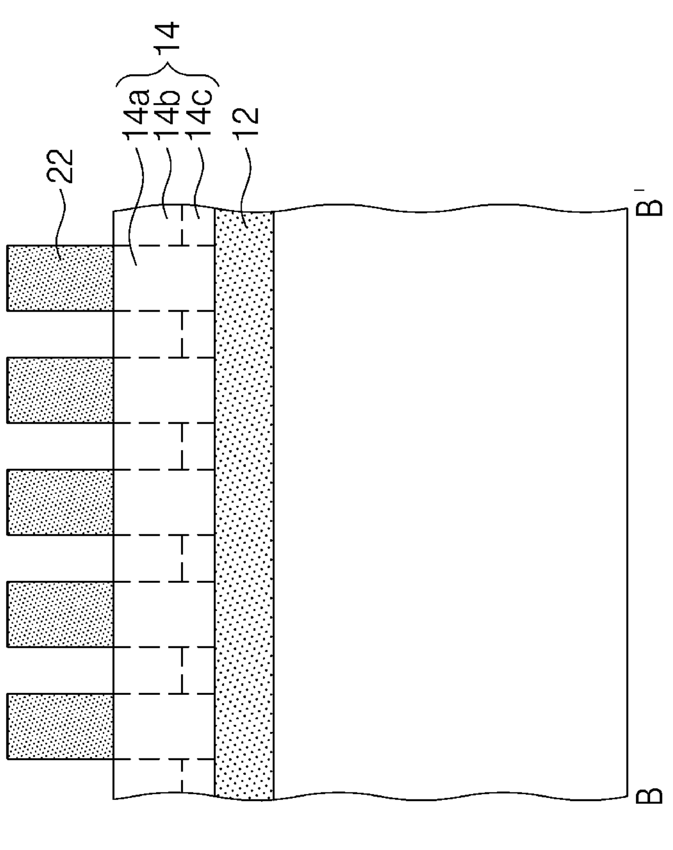
Figure 3:
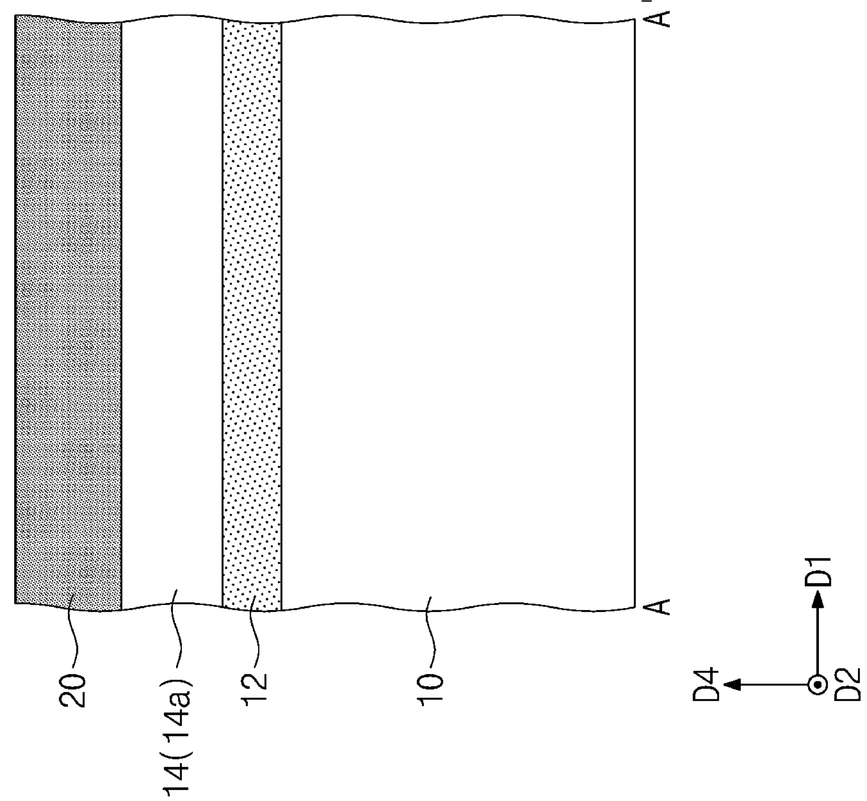

Referring to FIGS. 2 and 3, a substrate 10 including a peripheral region PR and a cell region CR may be provided. The substrate 10 may be a semiconductor substrate (e.g., a silicon substrate, a germanium substrate, or a silicon-germanium substrate). The peripheral region PR may be a region of the substrate 10, in which the peripheral block PB of FIG. 1 is provided, and the cell region CR may be another region of the substrate 10, in which each cell block CB of FIG. 1 is provided. A bottom surface of the substrate 10 may extend in a "horizontal" plane that is parallel to the first and second directions D1 and D2.

A lower mask layer 12 and an upper mask layer 14 may be sequentially formed on the substrate 10. The lower and upper mask layers 12 and 14 may be formed on the peripheral and cell regions PR and CR to cover a top surface of the substrate 10. The lower mask layer 12 may be formed of or include a material having a high etch selectivity with respect to the upper mask layer 14. As an example, the lower mask layer 12 may be formed of or include silicon oxide, and the upper mask layer 14 may be formed of or include polysilicon.

A first mask pattern 20 may be formed on the peripheral region PR, and a second mask pattern 22 may be formed on the cell region CR. In an embodiment, the first and second mask patterns 20 and 22 may be formed using a quadruple patterning technology (QPT). The first mask pattern 20 may be a multi-layered structure including at least one of carbon-based materials (e.g., amorphous carbon layer (ACL) and spin-on hardmask (SOH)) or silicon oxynitride. As an example, the first mask pattern 20 may be a multi-layered structure, in which a carbon-based material and a silicon oxynitride layer are sequentially stacked. The second mask pattern 22 may be a line-shaped pattern extended in a third direction D3, which is not parallel to the first and second directions D1 and D2 and is parallel to the bottom surface of the substrate 10. Adjacent ones of the second mask patterns 22 may be spaced apart from each other in the first direction D1. In an embodiment, the second mask pattern 22 may be formed of or include silicon oxide.

The upper mask layer 14 may include a first portion 14*a*, a second portion 14*b*, and a third portion 14*c*. The first portion 14*a* may be a region of the upper mask layer 14, which is vertically overlapped with the first and second mask patterns 20 and 22. A top surface of the first portion 14*a* may be in contact with a bottom surface of the first mask pattern 20 or a bottom surface of the second mask pattern 22, and a bottom surface of the first portion 14*a* may be in contact with a top surface of the lower mask layer 12. The second portion 14*b* may be another region of the upper mask layer 14, which is not vertically overlapped with the second mask pattern 22. A top surface of the second portion 14*b* may be exposed by the second mask pattern 22. The third portion 14*c* may be a region of the upper mask layer 14, which is not vertically overlapped with the second mask pattern 22 and is provided below the second portion 14*b*. A bottom surface of the third portion 14*c* may be in contact with the top surface of the lower mask layer 12. The second portion 14*b* may be removed by a removal process, which will be described with reference to FIG. 4, and the third portion 14*c* may be left below the second portion 14*b*. In other words, regions for the second and third portions 14*b* and 14*c* may be adjusted by the removal process of FIG. 4. Moreover, a final curvature of an active pattern AP to be described with reference to FIGS. 12 to 14 may also be adjusted by the removal process of FIG. 4.

Figure 4:
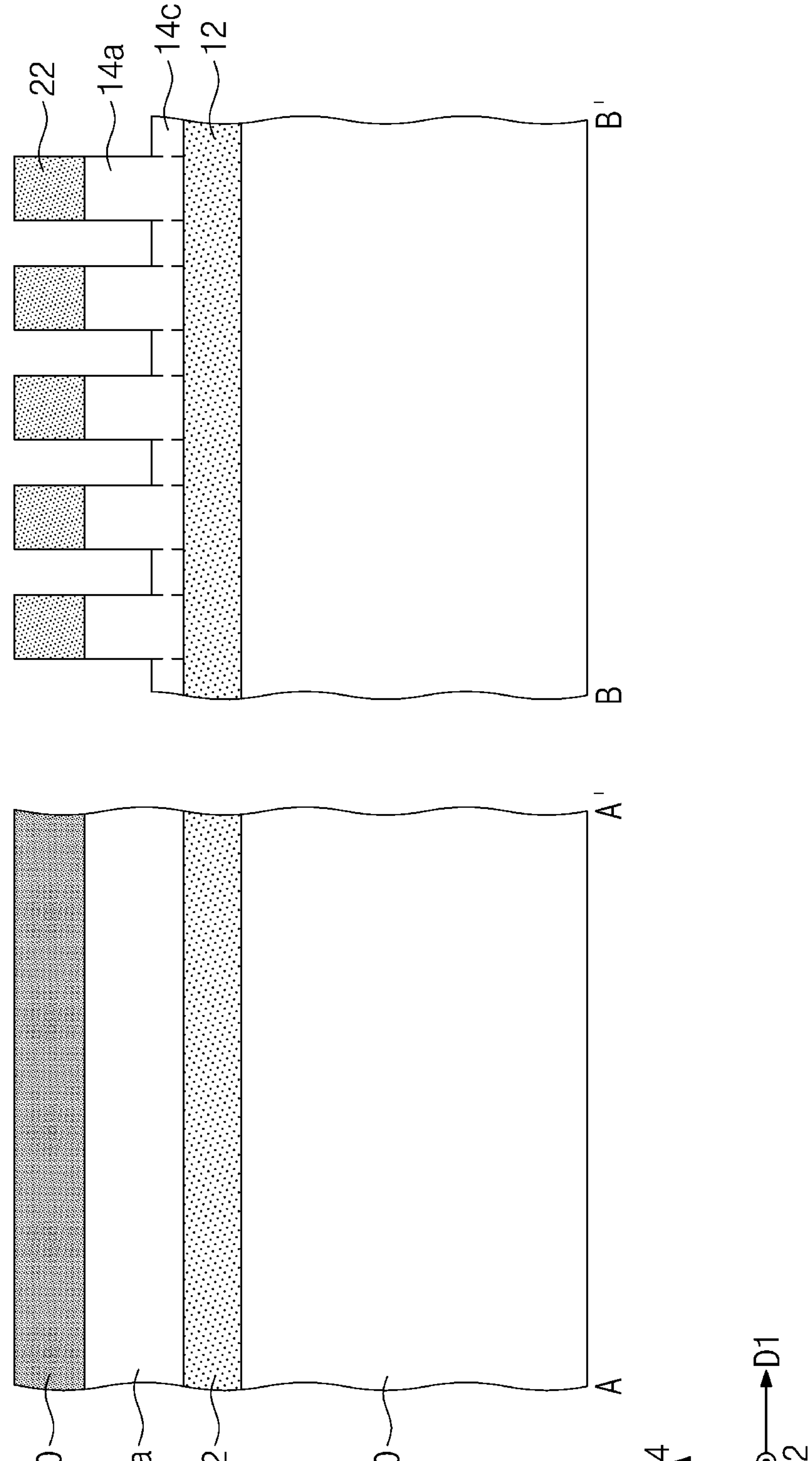

Referring to FIG. 4, the second portion 14*b* of the upper mask layer 14 may be removed from the cell region CR, however, the first and third portions 14*a* and 14*c* may not be removed by the removal process. The removal process may include an anisotropic etching process using the second mask pattern 22 as an etch mask.

In some embodiments, the first portion 14*a* may be left on the peripheral and cell regions PR and CR, and the third portion 14*c* may be left on the cell region CR. A top surface of the third portion 14*c* may be exposed to the outside and may be located at a height lower than a top surface of the first portion 14*a*. The top surface of the lower mask layer 12 may be covered with the first and third portions 14*a* and 14*c* and may not be exposed to the outside. In an embodiment, the removal process may be performed to remove an upper portion of the first mask pattern 20 and an upper portion of the second mask pattern 22.

Figure 5:
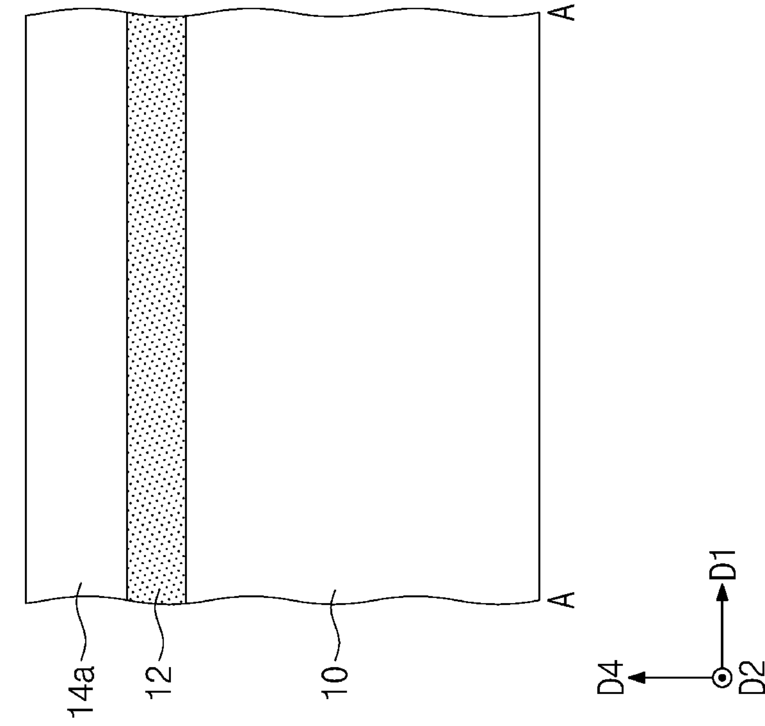

Referring to FIG. 5, the first mask pattern 20 on the peripheral region PR may be removed. The removal process may include performing an ashing process. As a result of the removal process, the top surface of the first portion 14*a* on the peripheral region PR may become exposed. Thereafter, the top surface of the first portion 14*a* on the cell region CR may be covered with the second mask pattern 22 and may not be exposed to the outside. The removal process of the first mask pattern 20 and the removal process of the second portion 14*b* of the upper mask layer 14 may be performed in an in-situ manner.

Referring to FIG. 6, an etching process may be performed on the upper mask layer 14 to form an upper mask pattern 15. The etching process may include an anisotropic etching process, which is performed using the second mask pattern 22 as an etch mask. An upper portion of the second mask pattern 22 may then be etched using this etching process. In detail, the third portion 14*c* on the cell region CR may be etched. Accordingly, the lower mask layer 12 may be partially exposed, as shown. For example, the lower mask layer 12 may be exposed to the outside at regions that are not vertically overlapped with the second mask patterns 22. The first portion 14*a* of the upper mask layer 14 on the cell region CR may not be etched by the etching process, and the unetched portion (i.e., the first portion 14*a*) may be used as the upper mask pattern 15.

On the peripheral region PR, an upper portion of the first portion 14*a* of the upper mask layer 14 may be etched by the etching process. Accordingly, a thickness, in a fourth direction D4, of the first portion 14*a* on the peripheral region PR may be reduced. The fourth direction D4 may be a direction perpendicular to the bottom surface of the substrate 10. A remaining portion of the first portion 14*a* on the peripheral region PR may not be etched by the etching process and may be left on the lower mask layer 12 to constitute the upper mask pattern 15 on the peripheral region PR.

A top surface of the upper mask pattern 15 on the peripheral region PR may be located at a height that is substantially equal to or lower than a top surface of the upper mask pattern 15 on the cell region CR. When measured in the fourth direction D4, a thickness of the upper mask pattern 15 on the peripheral region PR may be substantially equal to or smaller than a thickness of the upper mask pattern 15 on the cell region CR. A thickness difference between the upper mask patterns 15 on the peripheral and cell regions PR and CR may be adjusted by the removal process described with reference to FIG. 4. Thicknesses of the second and third portions 14*b* and 14*c* may be defined by the removal process of FIG. 4. The larger the thickness of the third portion 14*c* (i.e., the smaller the amount of the upper mask layer 14 removed by the removal process of FIG. 4), the larger the thickness difference between the upper mask patterns 15.

Referring to FIG. 7, the second mask pattern 22 may be removed. The lower mask layer 12 on the cell region CR may be partially etched during the removal of the second mask pattern 22. For example, a portion of the lower mask layer 12, which is not be vertically overlapped with the upper mask pattern 15 and is exposed by the upper mask pattern 15, may be etched during the removal of the second mask pattern 22. The top surface of the substrate 10 may be covered with the lower mask layer 12 and may not be exposed. The lower mask layer 12 on the peripheral region PR may not be removed.

Figure 9:
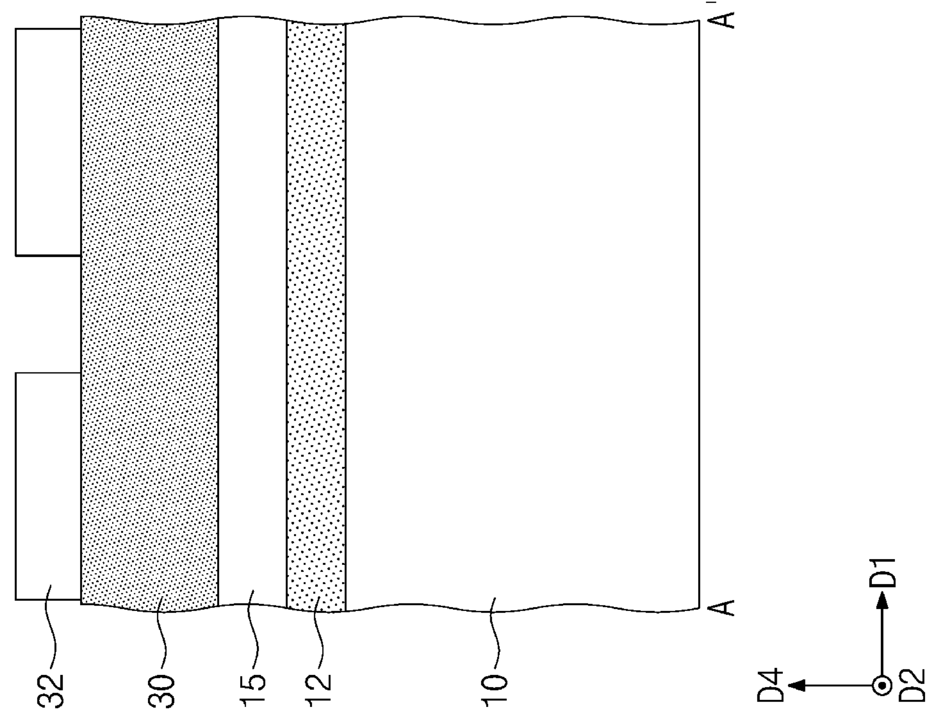

Referring to FIGS. 8 and 9, a third mask layer 30 and a photoresist pattern 32 may be sequentially formed. In detail, the third mask layer 30 may be formed on the peripheral and cell regions PR and CR to cover the upper mask pattern 15. Thereafter, a photoresist layer (not shown) may be formed to cover the third mask layer 30, and then, the photoresist pattern 32 may be formed by patterning the photoresist layer using exposing and developing processes.

On the peripheral region PR, adjacent ones of the photoresist patterns 32 may be spaced apart from each other in the first direction D1. On the cell region CR, the photoresist pattern 32 may include holes H that are spaced apart from each other in the first and second directions D1 and D2. As shown, each of the holes H may be vertically overlapped with a portion of the upper mask pattern 15.

Figures 10, 11:
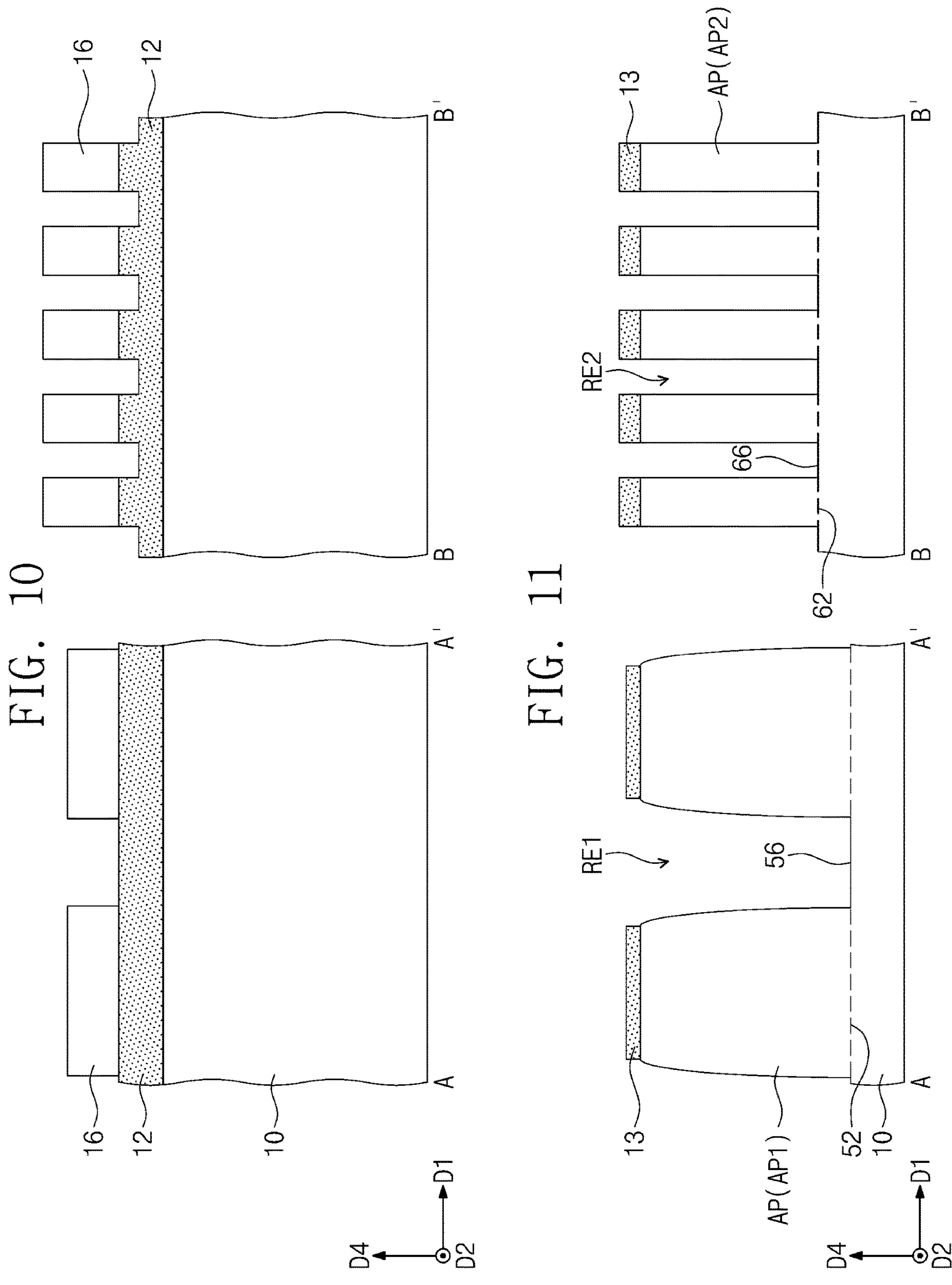

Referring to FIG. 10, the third mask layer 30 may be etched using the photoresist pattern 32 as an etch mask, and as a result, a third mask pattern (not shown) may be formed. Next, a fourth mask pattern 16 may be formed by etching the upper mask pattern 15 using the third mask pattern as an etch mask. Although not shown, when viewed from a plan perspective, the upper mask pattern 15, which has a line shape extending in the third direction D3 on the cell region CR, may be divided into a plurality of fourth mask patterns 16, which are a bar shape extending in the third direction D3 and are spaced apart from each other in the third direction D3. The fourth mask pattern 16 on the peripheral region PR may have substantially the same shape as the photoresist pattern 32, when viewed in a plan view.

As an example, the etching process using the photoresist pattern 32 and the third mask pattern may be performed only one time. As another example, the etching process may be performed several times. In this case, the positions of the holes H of FIG. 8 may be changed whenever each etching process is performed.

A top surface of the fourth mask pattern 16 on the peripheral region PR may be located at a height that is substantially equal to or lower than a top surface of the fourth mask pattern 16 on the cell region CR. When measured in the fourth direction D4, a thickness of the fourth mask pattern 16 on the peripheral region PR may be substantially equal to or smaller than a thickness of the fourth mask pattern 16 on the cell region CR. A thickness difference between the fourth mask patterns 16 on the peripheral and cell regions PR and CR may be proportional to the thickness difference between the upper mask patterns 15 on the peripheral and cell regions PR and CR described with reference to FIG. 6. As a result, the thickness difference between the fourth mask patterns 16 may be controlled through the removal process described with reference to FIG. 4. A width of a bottom surface of the fourth mask pattern 16 on the peripheral region PR may be larger than a width of a bottom surface of the fourth mask pattern 16 on the cell region CR.

Referring to FIG. 11, the lower mask layer 12 and an upper portion of the substrate 10 may be etched using the fourth mask pattern 16 as an etch mask, and as a result, a lower mask pattern 13 and the active pattern AP may be formed. The active pattern AP may include a first active pattern AP1 and a second active pattern AP2, which are respectively provided on the peripheral and cell regions PR and CR. The active pattern AP may be an unetched upper portion of the substrate 10. Hereinafter, a remaining portion of the substrate 10 other than the active pattern AP may be referred to as the substrate 10, for convenience in description. Accordingly, the active pattern AP may protrude from the substrate 10, and a bottom surface of the active pattern AP may be in contact with the top surface of the substrate 10. In detail, a bottom surface 52 of the first active pattern AP1 may be in contact with a top surface 56 of the substrate 10 on the peripheral region PR, and a bottom surface 62 of the second active pattern AP2 may be in contact with a top surface 66 of the substrate 10 on the cell region CR. When measured at the same height, a width of the first active pattern AP1 in the first direction D1 may be larger than a width of the second active pattern AP2 in the first direction D1. As an example, a width of a top surface 54 of the first active pattern AP1 may be larger than a width of a top surface of the second active pattern AP2.

A recess may be formed between adjacent ones of the active patterns AP. A first recess RE1 may be formed between adjacent ones of the first active patterns AP1, and a second recess RE2 may be formed between adjacent ones of the second active patterns AP2. When measured at the same height, a width of the first recess RE1 may be larger than a width of the second recess RE2. A depth of the first recess RE1 may be different from a depth of the second recess RE2. As an example, in the case where the first recess RE1 has a larger width than the second recess RE2, the first recess RE1 may be deeper than the second recess RE2, due to an etch loading effect. As another example, in the case where the first recess RE1 has a larger width than the second recess RE2, an area to be etched may be larger in the first recess RE1 than in the second recess RE2, and thus, the depth of the first recess RE1 may be smaller than the depth of the second recess RE2. Accordingly, a length L1 of the first active pattern AP1 in the fourth direction D4 may be different from a length L2 of the second active pattern AP2 in the fourth direction D4.

The lower mask pattern 13 may be formed on the active pattern AP. A top surface of the lower mask pattern 13 on the peripheral region PR may be located at a height that is substantially equal to or lower than a top surface of the lower mask pattern 13 on the cell region CR. When measured in the fourth direction D4, the thickness of the lower mask pattern 13 on the peripheral region PR may be substantially equal to or smaller than the thickness of the lower mask pattern 13 on the cell region CR. A thickness difference between the lower mask patterns 13 on the peripheral and cell regions PR and CR may be adjusted by the thickness difference between the fourth mask patterns 16 on the peripheral and cell regions PR and CR described with reference to FIG. 10. As a result, the thickness difference between the lower mask patterns 13 may be controlled by the removal process described with reference to FIG. 4.

Figure 12:
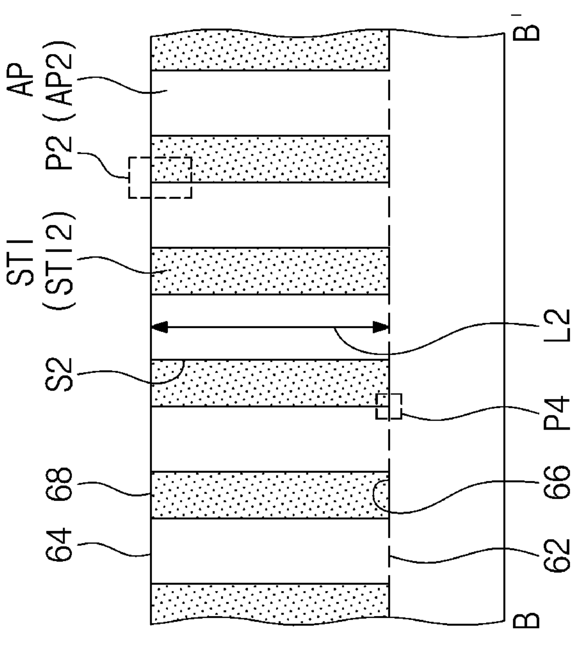
Figure 12:
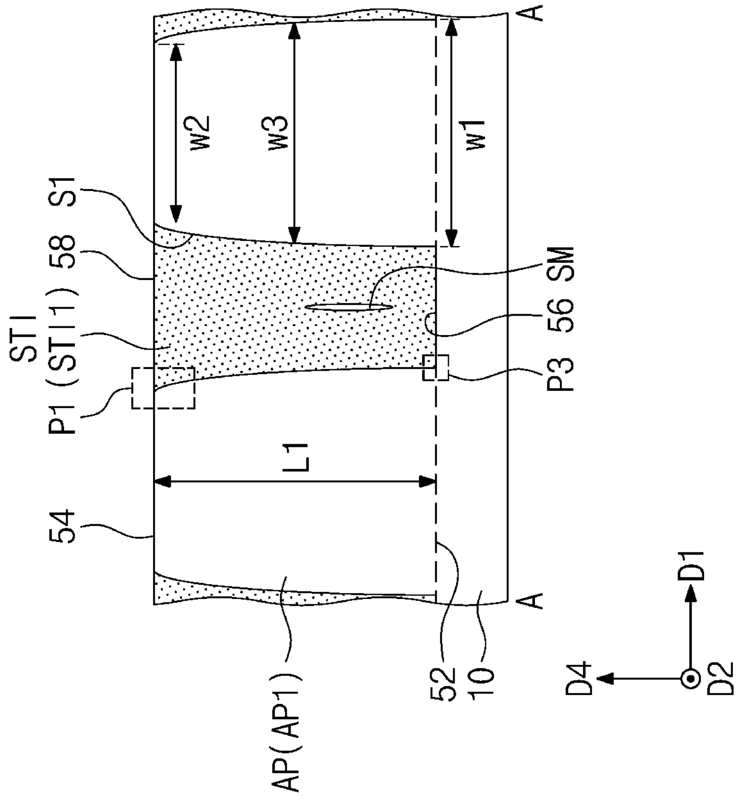

Referring to FIG. 12, the lower mask pattern 13 may be removed. Next, the recess may be filled with a device isolation pattern STI. In detail, the device isolation pattern STI may include a first device isolation pattern STI1, which is formed to fill the first recess RE1, and a second device isolation pattern STI2, which is formed to fill the second recess RE2. The device isolation pattern STI may be formed of (or include) at least one of silicon oxide, silicon nitride, or combinations thereof.

The first device isolation pattern STI1 may include a seam SM formed therein. In an embodiment, the seam SM may be an empty space (e.g., air-filled void). A top portion of the seam SM may be located at a height that is lower than a top surface 58 of the first device isolation pattern STI1. In other words, the seam SM may not be exposed to the outside of the first device isolation pattern STI1.

Referring to FIGS. 12 to 14, a top surface of the device isolation pattern STI may be located at a height that is substantially equal to or lower than a top surface of the active pattern AP adjacent thereto. In detail, a top surface 58 of the first device isolation pattern STI1 may be located at a height that is substantially equal to or lower than the top surface 54 of the first active pattern AP1, and a top surface 68 of the second device isolation pattern STI2 may be located at a height that is substantially equal to or lower than a top surface 64 of the second active pattern AP2. As an example, the top surface 58 of the first device isolation pattern STI1 may be located at substantially the same height as the top surface 54 of the first active pattern AP1, as shown in FIG. 13. As another example, the top surface 58 of the first device isolation pattern STI1 may be located at a height lower than the top surface 54 of the first active pattern AP1, as shown in FIG. 14.

An edge of an upper portion of the active pattern AP may have a rounded shape. As an example, the edge of the upper portion of the active pattern AP may have a convexly rounded shape. As shown by FIG. 13, first edge EG1 of an upper portion of the first active pattern AP1 may have a more rounded shape than a second edge EG2 of an upper portion of the second active pattern AP2. In other words, a curvature of the first edge EG1 may be greater than a curvature of the second edge EG2 (i.e., a radius of curvature of the first edge EG1 may be less than a radius of curvature of the second edge EG2).

A curvature difference between the first and second edges EG1 and EG2 may be adjusted by the thickness difference between the fourth mask patterns 16 on the peripheral and cell regions PR and CR described with reference to FIG. 10. The larger the thickness difference between the fourth mask patterns 16 on the peripheral and cell regions PR and CR, the larger the curvature difference. This is because the fourth mask pattern 16 is used as an etch mask in a process of forming the active pattern AP. As an example, when the first active pattern AP1 is formed, the smaller the thickness of the fourth mask pattern 16 on the peripheral region PR, the greater the etching amount of the first edge EG1, and this may lead to an increase of the curvature of the first edge EG1. The curvature difference between the first and second edges EG1 and EG2 may be increased. As a result, the curvature difference between the first and second edges EG1 and EG2 may be controlled by the removal process described with reference to FIG. 4.

The first active pattern AP1 may have a first width w1, a second width w2, and a third width w3. The first width w1 may be a width of the bottom surface 52 of the first active pattern AP1. The second width w2 may be a width of the top surface 54 of the first active pattern AP1. The third width w3 may be a width of the first active pattern AP1 measured at a height (e.g., middle point) between the bottom and top surfaces 52 and 54 of the first active pattern AP1. The third width w3 may be smaller than the first width w1 and may be larger than the second width w2. A difference between the third width w3 and the first width w1 may be smaller than a difference between the third width w3 and the second width w2.

Referring to FIGS. 12 and 15, the first active pattern AP1 and the second active pattern AP2 may have a first side surface 51 and a second side surface S2, respectively. The first side surface 51 and the second side surface S2 may be in contact with the first device isolation pattern STI1 and the second device isolation pattern STI2, respectively. At a bottom level of the first active pattern AP1, the first side surface 51 may be inclined at a first angle A1 relative to the top surface 56 of the substrate 10 on the peripheral region PR. At a bottom level of the second active pattern AP2, the second side surface S2 may be inclined at a second angle A2 relative to the top surface 66 of the substrate 10 on the cell region CR. Each of the first angle A1 and the second angle A2 may be greater than 90°. The first angle A1 may be substantially equal to or greater than the second angle A2.

Figure 19:
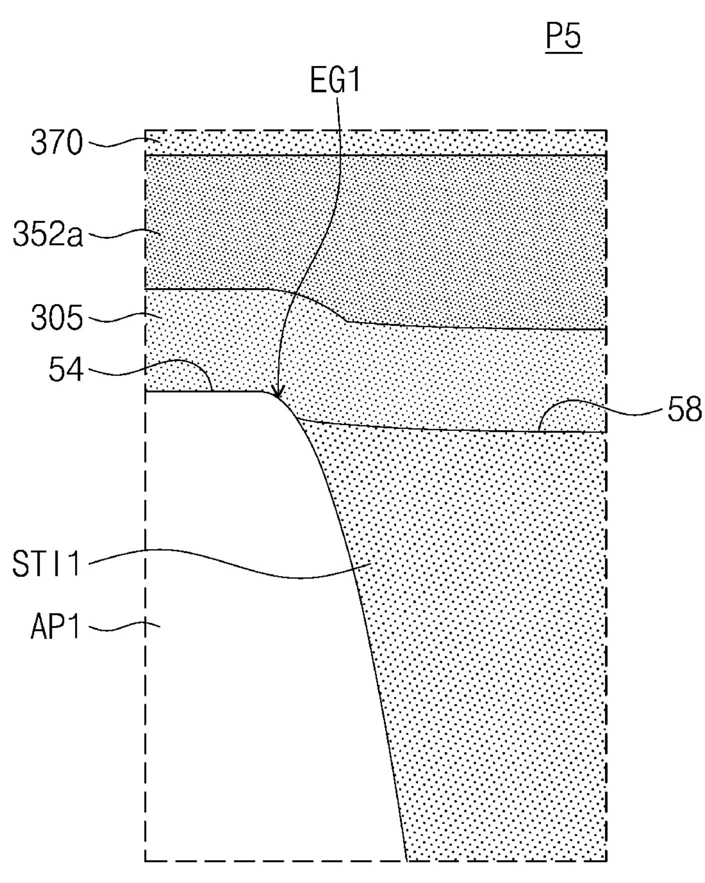

According to an embodiment of the inventive concept, the second portion **14*b* of the upper mask layer 14 on the cell region CR may be removed, in advance, before the removal of the first mask pattern 20 on the peripheral region PR. In contrast, the third portion 14*c* of the upper mask layer 14 may be removed after the removal of the first mask pattern 20. In other words, the upper mask layer 14 on the peripheral region PR may not be covered with the first mask pattern 20, during the removal process of the third portion 14*c*. Thus, an upper portion of the upper mask layer 14 on the peripheral region PR may also be removed. Accordingly, a thickness, in the fourth direction D4, of the fourth mask pattern 16 to be formed in a subsequent step may have a relatively small value on the peripheral region PR. In other words, the fourth mask pattern 16, which is used as an etch mask in a process of forming the first active pattern AP1, may have a reduced thickness on the peripheral region PR. Thus, the first active pattern AP1 may be more affected by an etching process that is performed to form the active pattern AP, compared with the case that the fourth mask pattern 16 on the peripheral region PR is not thinned. As a result, the first edge EG1 of the first active pattern AP1 may have a rounded shape, and as illustrated in FIG. 19, a bottom surface of a gate dielectric pattern 305 may have a rounded shape, due to the rounded shape of the first edge EG1. Thus, advantageously, it may be possible to prevent an excessive electric field from being concentrated on the gate dielectric pattern 305 near the first edge EG1 and thereby to prevent the gate dielectric pattern 305** from being deteriorated (e.g., undergoing field-induced breakdown). Accordingly, it may be possible to improve reliability of the semiconductor device.

In addition, due to the stronger effect of the etching process on the first active pattern AP1, the first angle A1 between the first side surface S1 of the first active pattern AP1 and the top surface 56 of the substrate 10 may be greater than 90°. Accordingly, the seam SM in the first device isolation pattern STI1 may be formed in a lower portion of the first device isolation pattern STI1 and may not be exposed to the outside of the first device isolation pattern STI1. As a result, it may be possible to reduce process failures (e.g., residues in exposed seams) in a subsequent process and thereby to increase a production yield.

Figure 16:
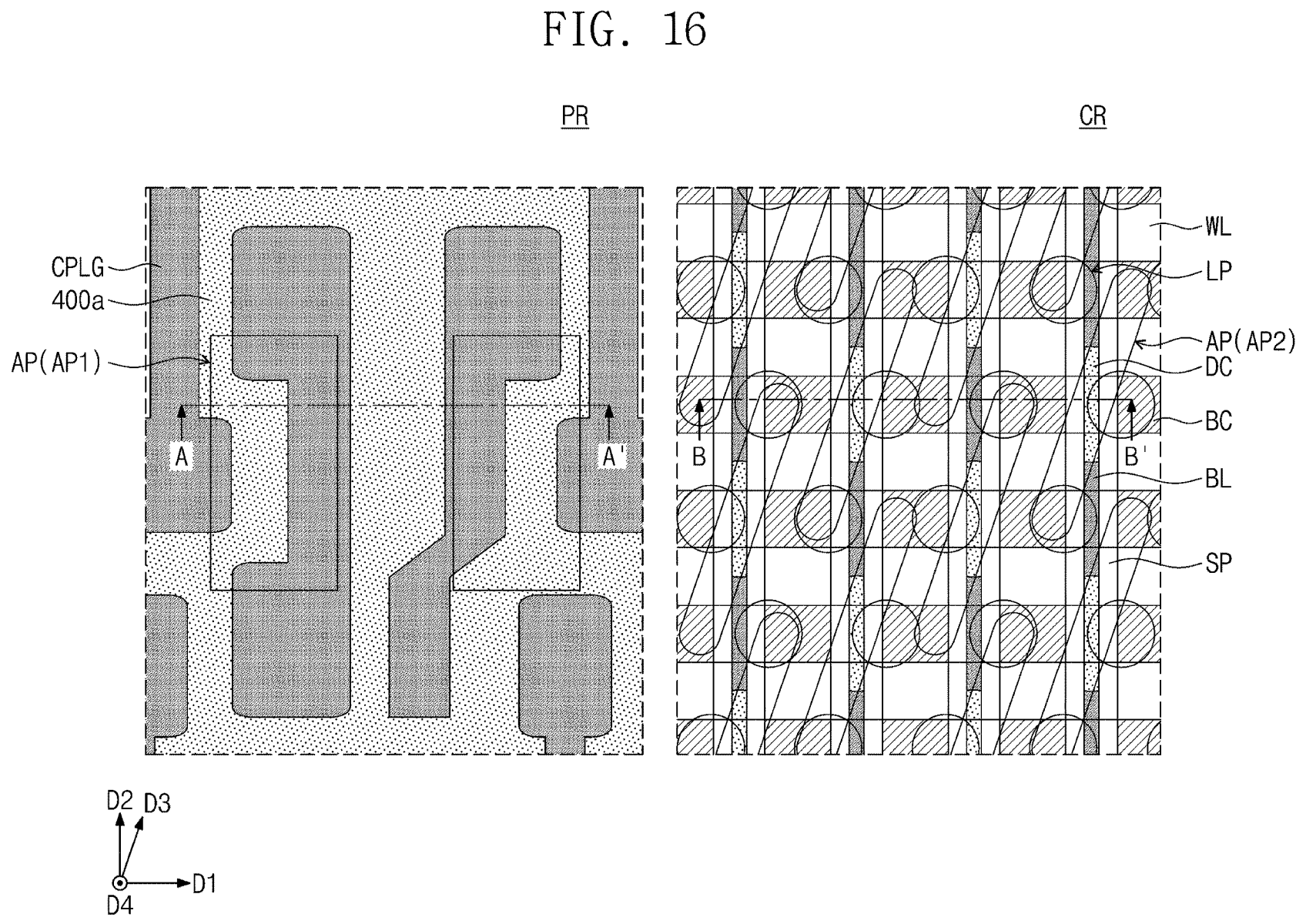
Figure 17:
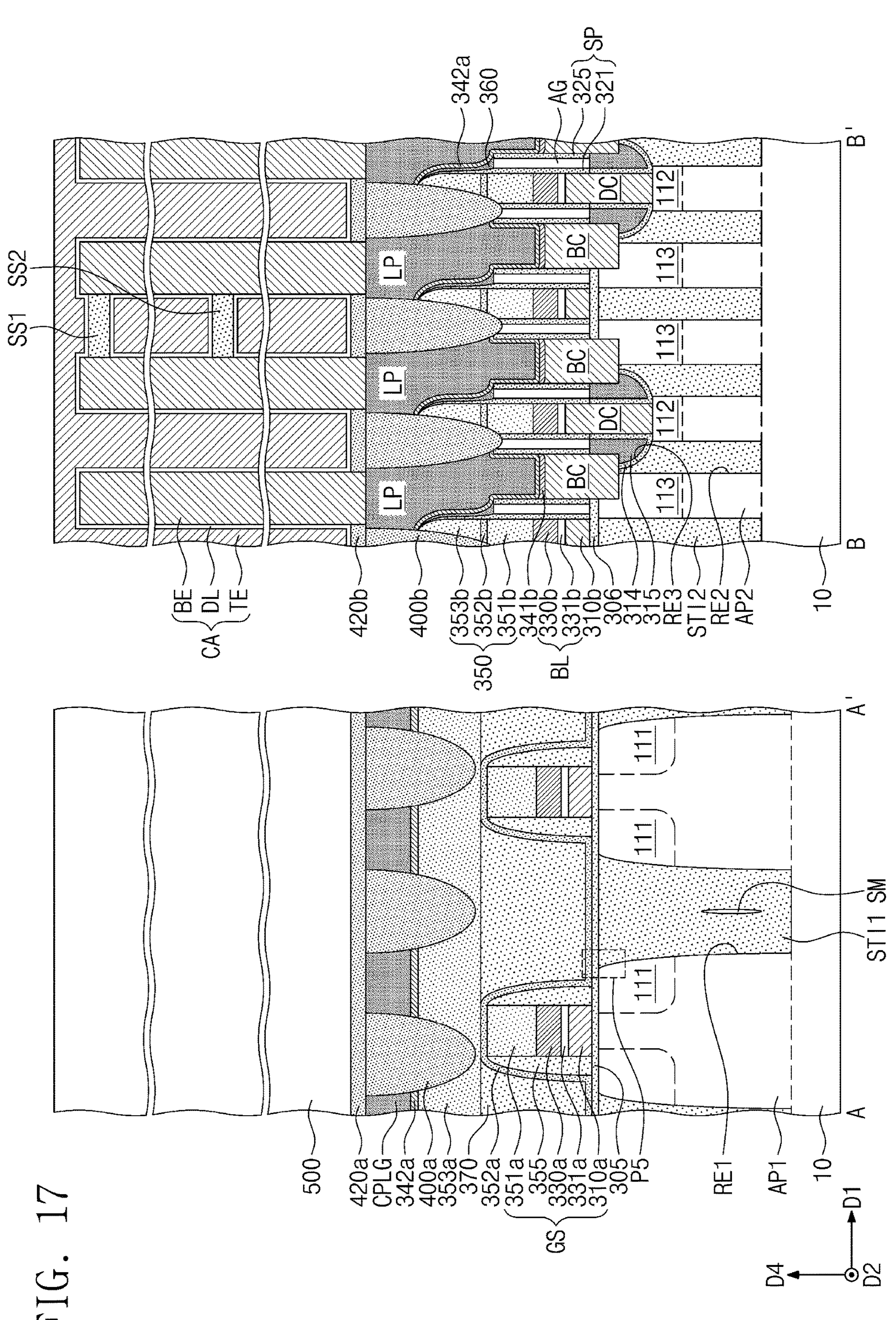
FIG. 17 is a sectional view taken along lines A-A' and B-B' of FIG. 16.
Figure 18:
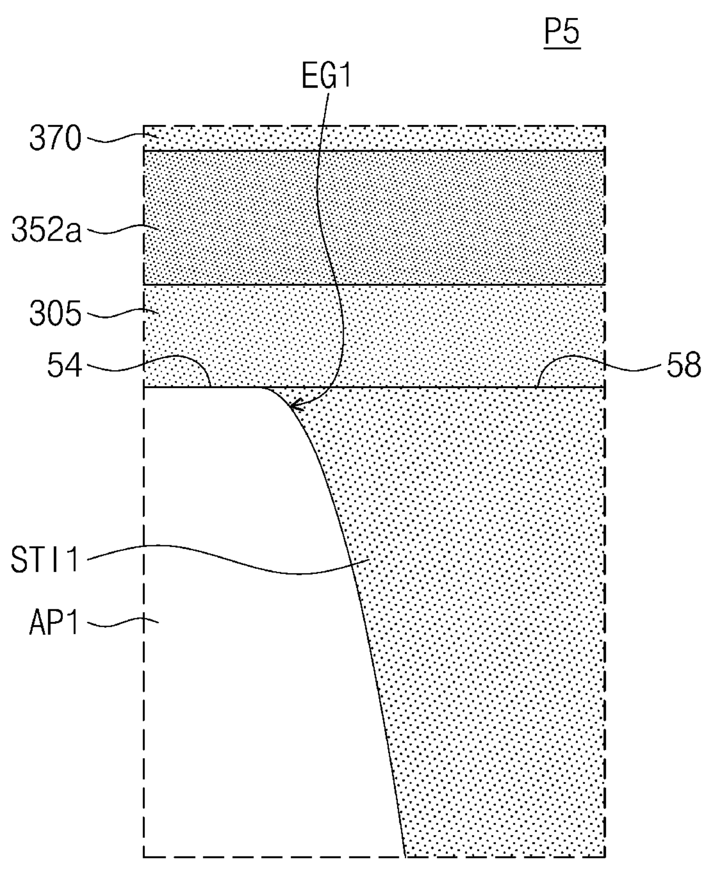
FIGS. 18 and 19 are enlarged sectional views corresponding to a portion P5 of FIG. 17.

FIG. 16 is a plan layout view illustrating a semiconductor device according to an embodiment of the inventive concept, and FIG. 17 is a cross-sectional view taken along lines A-A' and B-B' of FIG. 16. FIGS. 18 and 19 are enlarged sectional views corresponding to a portion P5 of FIG. 17.

Referring to FIGS. 16 to 19, the substrate 10 including the peripheral and cell regions PR and CR may be provided. The substrate 10 may be a semiconductor substrate (e.g., a silicon substrate, a germanium substrate, or a silicon-germanium substrate). The active pattern AP may be disposed on the substrate 10. The active pattern AP may protrude from the substrate 10. The active pattern AP may include the first active pattern AP1 and the second active pattern AP2, which are respectively disposed on the peripheral and cell regions PR and CR. When viewed from a plan perspective, the second active pattern AP2 may be a bar-shaped pattern extending in the third direction D3.

The first active pattern AP1 may have the first edge EG1 provided at an upper portion thereof, and the second active pattern AP2 may have the second edge EG2 provided at an upper portion thereof. The first and second edges EG1 and EG2 may have a rounded shape. A curvature of the first edge EG1 may be larger than a curvature of the second edge EG2, as further shown by FIG. 14.

The device isolation pattern STI may be disposed between adjacent ones of the active pattern AP. The device isolation pattern STI may include the first device isolation pattern STI1, which is interposed between the first active patterns AP1, and the second device isolation pattern STI2, which is interposed between the second active patterns AP2. The device isolation pattern STI may be formed of or include at least one of silicon oxide, silicon nitride, or combinations thereof. The first device isolation pattern STI1 of the device isolation pattern STI may include the seam SM provided therein.

A top surface of the device isolation pattern STI may be located at a height that is substantially equal to or lower than a top surface of the active pattern AP adjacent thereto. The top surface 58 of the first device isolation pattern STI1 may be located at a height that is substantially equal to or lower than the top surface 54 of the first active pattern AP1. As an example, the top surface 58 of the first device isolation pattern STI1 may be located at substantially the same height as the top surface 54 of the first active pattern AP1, as shown in FIG. 18. As another example, the top surface 58 of the first device isolation pattern STI1 may be located at a height lower than the top surface 54 of the first active pattern AP1, as shown in FIG. 19.

Impurity regions may be provided in the active pattern AP. The impurity regions may include a first impurity region 111, a second impurity region 112, and a third impurity region 113. The first impurity region 111 may be provided in an upper portion of the first active pattern AP1. The second impurity region 112 may be provided in an upper portion of the second active pattern AP2 and may be provided adjacent to a center portion of the second active pattern AP2, when viewed in a plan view. The third impurity region 113 may be provided in an upper portion of the second active pattern AP2 and may be provided adjacent to an end portion of the second active pattern AP2, when viewed in a plan view. The second impurity region 112 may be doped with impurities to have the same conductivity type (e.g., n-type) as the third impurity region 113.

A pair of word lines WL may be provided on the cell region CR to cross the second active pattern AP2 in the first direction D1. The pair of word lines WL may be spaced apart from each other in the second direction D2. The second impurity region 112 may be interposed between the pair of word lines WL, and the third impurity region 113 may be provided near an end portion of the second active pattern AP2, which is not interposed between the pair of word lines WL. The pair of word lines WL may be buried in the substrate 10.

On the peripheral region PR, the gate dielectric pattern 305 and a gate structure GS may be disposed on the first active pattern AP1. The gate dielectric pattern 305 and the gate structure GS may be sequentially stacked on the first active pattern AP1. The gate dielectric pattern 305 may be extended along the top surface 54 of the first active pattern AP1 and the top surface 58 of the first device isolation pattern STI1. In an embodiment, the gate dielectric pattern 305 may be formed of or include silicon oxide.

A top surface of the gate dielectric pattern 305 on the first device isolation pattern STI1 may be located at a height that is substantially equal to or lower than a top surface of the gate dielectric pattern 305 on the first active pattern AP1. As an example, as shown in FIG. 18, the top surface of the gate dielectric pattern 305 on the first device isolation pattern STI1 may be located at substantially the same height as the top surface of the gate dielectric pattern 305 on the first active pattern AP1. As another example, as shown in FIG. 19, the top surface of the gate dielectric pattern 305 on the first device isolation pattern STI1 may be located at a height lower than the top surface of the gate dielectric pattern 305 on the first active pattern AP1.

Due to the aforementioned curvature and shape of the first edge EG1, a bottom surface of the gate dielectric pattern 305 may also have a rounded shape. That is, the gate dielectric pattern 305 may have a curvature (i.e., non-flat profile) at a region adjacent to the first edge EG1 of the upper portion of the first active pattern AP1. Unfortunately, in the case where the first edge EG1 has a sharp shape, the bottom surface of the gate dielectric pattern 305 may also have a sharp shape corresponding to the shape of the first edge EG1. In this case, an electric field may be concentrated on the sharp region, during an operation of the semiconductor device, and thus, the gate dielectric pattern 305 may be deteriorated. By contrast, as in the aforementioned embodiment(s), in the case where the bottom surface of the gate dielectric pattern 305 has a non-sharp or rounded shape, it may be possible to prevent the electric field from being overly concentrated on the gate dielectric pattern 305 and thereby to prevent the gate dielectric pattern 305 from being deteriorated through dielectric field-induced breakdown.

The gate structure GS may be provided to cross the first active pattern AP1. The gate structure GS may include a peripheral polysilicon pattern 310*a*, a first peripheral ohmic pattern 331*a*, a peripheral metal-containing pattern 330*a*, a first peripheral capping pattern 351*a*, and a spacer 355. The peripheral polysilicon pattern 310*a*, the first peripheral ohmic pattern 331*a*, the peripheral metal-containing pattern 330*a*, and the first peripheral capping pattern 351*a* may be sequentially stacked on the gate dielectric pattern 305. The spacer 355 may be provided on a side surface of the peripheral polysilicon pattern 310*a*, a side surface of the first peripheral ohmic pattern 331*a*, a side surface of the peripheral metal-containing pattern 330*a*, and a side surface of the first peripheral capping pattern 351*a*. A second peripheral capping pattern 352*a* may be provided to cover a top surface of the first peripheral capping pattern 351*a* and may be extended along a side surface of the spacer 355 and the top surface of the gate dielectric pattern 305 to have a substantially uniform thickness. A lower insulating pattern 370 may be provided to enclose the gate structure GS and the second peripheral capping pattern 352*a*.

In an embodiment, the peripheral polysilicon pattern 310*a* may be formed of or include doped or undoped polysilicon. The first peripheral ohmic pattern 331*a* may be formed of or include at least one of metal silicide materials. The peripheral metal-containing pattern 330*a* may be formed of or include at least one of metallic materials (e.g., tungsten, titanium, and tantalum). The first and second peripheral capping patterns 351*a* and 352*a* may be formed of or include silicon nitride. The spacer 355 may be formed of or include silicon oxide.

A third peripheral capping pattern 353*a*, a peripheral diffusion-prevention pattern 342*a*, and a contact plug CPLG may be sequentially stacked on the lower insulating pattern 370. A peripheral filling pattern 400*a* may be interposed between adjacent ones of the contact plugs CPLG. The peripheral filling pattern 400*a* may penetrate the peripheral diffusion-prevention pattern 342*a* and may be extended into the third peripheral capping pattern 353*a*.

According to an embodiment, the third peripheral capping pattern 353*a* may be formed of or include silicon nitride. The peripheral diffusion-prevention pattern 342*a* may be formed of or include at least one of metal nitride materials (e.g., titanium nitride and tantalum nitride). The contact plug CPLG may be formed of or include a metal-containing material (e.g., tungsten).

A peripheral etch-stop pattern 420*a* and an upper insulating pattern 500 may be sequentially stacked on the contact plug CPLG and the peripheral filling pattern 400*a*. In an embodiment, the peripheral etch-stop pattern 420*a* may be formed of or include SiBN. The etch-stop pattern 420 may include a single layer or a plurality of layers. As an example, the upper insulating pattern 500 may be formed of or include silicon oxide.

On the cell region CR, a buffer pattern 306 may be provided to cover the second active pattern AP2, the second device isolation pattern STI2, and the pair of word lines WL. In an embodiment, the buffer pattern 306 may be formed of or include at least one of silicon oxide, silicon nitride, and/or silicon oxynitride.

Bit lines BL may be disposed on the buffer pattern 306. The bit lines BL may be extended in the second direction D2 and may be spaced apart from each other in the first direction D1. Each of the bit lines BL may include a first cell ohmic pattern 331*b* and a cell metal-containing pattern 330*b*, which are sequentially stacked. The first cell ohmic pattern 331*b* and the cell metal-containing pattern 330*b* may be formed of or include the same materials as the first peripheral ohmic pattern 331*a* and the peripheral metal-containing pattern 330*a*, respectively.

Cell polysilicon patterns 310*b* may be interposed between the bit lines BL and the buffer pattern 306. The cell polysilicon patterns 310*b* may be formed of or include the same material as the peripheral polysilicon pattern 310*a*.

Bit line contacts DC may be respectively interposed between the bit lines BL and the second impurity regions 112. The bit lines BL may be electrically connected to the second impurity regions 112 by the bit line contacts DC. The bit line contacts DC may be formed of or include doped or undoped polysilicon.

The bit line contacts DC may be disposed in a third recess region RE3. The third recess region RE3 may be provided in an upper portion of the second impurity region 112 and an upper portion of the second device isolation pattern STI2 adjacent thereto. A first "gap fill" insulating pattern 314 and a second "gap fill" insulating pattern 315 may be provided to fill a remaining portion of the third recess region RE3.

A cell capping pattern 350 may be provided on each of the bit lines BL and may be extended in the second direction D2. The cell capping pattern 350 may include a first cell capping pattern 351*b*, a second cell capping pattern 352*b*, and a third cell capping pattern 353*b*, which are sequentially stacked and are extended in the second direction D2. The first to third cell capping patterns 351*b*, 352*b*, and 353*b* may be formed of or include the same materials as the first to third peripheral capping patterns 351*a*, 352*a*, and 353*a*, respectively.

A side surface of each of the cell polysilicon patterns 310*b*, an upper side surface of each of the bit line contacts DC, a side surface of each of the bit lines BL, and a side surface of the cell capping pattern 350 may be covered with a bit line spacer SP. The bit line spacer SP may be provided on each of the bit lines BL and may be extended in the second direction D2.

The bit line spacer SP may include a first sub-spacer 321 and a second sub-spacer 325, which are spaced apart from each other. In an embodiment, the first sub-spacer 321 and the second sub-spacer 325 may be spaced apart from each other by an air gap AG. The first sub-spacer 321 may be in contact with a side surface of each of the bit lines BL and may be extended to cover the side surface of the cell capping pattern 350. The second sub-spacer 325 may be provided along a side surface of the first sub-spacer 321. The first and second sub-spacers 321 and 325 may be formed of or include silicon nitride.

An upper spacer 360 may cover the side surface of the first sub-spacer 321 and may be extended to a region on a top surface of the second sub-spacer 325. The upper spacer 360 may cover or stop the air gap AG.

Storage node contacts BC may be interposed between adjacent ones of the bit lines BL. The storage node contacts BC may be spaced apart from each other in the first and second directions D1 and D2. The storage node contacts BC may be formed of or include doped or undoped polysilicon.

A second cell ohmic pattern 341*b* may be disposed on each of the storage node contacts BC. A cell diffusion-prevention pattern 342*b* may be provided to conformally cover the second cell ohmic pattern 341*b*, the bit line spacer SP, and the cell capping pattern 350. In some additional embodiments, the cell diffusion-prevention pattern 342*b* may be formed of or include the same material as the peripheral diffusion-prevention pattern 342*a*. The second cell ohmic pattern 341*b* may be interposed between the cell diffusion-prevention pattern 342*b* and each of the storage node contacts BC.

Landing pads LP may be disposed on the storage node contacts BC, respectively. The landing pads LP may be spaced apart from each other in the first and second directions D1 and D2. The landing pads LP may be formed of or include a metal-containing material, such as tungsten (W), for example.

A cell filling pattern 400*b* may be provided to enclose each of the landing pads LP. The cell filling pattern 400*b* may be interposed between adjacent ones of the landing pads LP. The cell filling pattern 400_b_ may be formed of or include the same material as the peripheral filling pattern 400_a_.

Bottom electrodes BE may be disposed on the landing pads LP, respectively. The bottom electrodes BE may be formed of or include at least one of doped polysilicon, metal nitride materials (e.g., titanium nitride), or metallic materials (e.g., tungsten, aluminum, and copper). Each of the bottom electrodes BE may be shaped like a circular pillar, a hollow cylinder, or a cup. An upper supporting pattern SS1 may be provided to support upper side surfaces of the bottom electrodes BE, and a lower supporting pattern SS2 may be provided to support lower side surfaces of the bottom electrodes BE. The upper and lower supporting patterns SS1 and SS2 may be formed of or include at least one of insulating materials (e.g., silicon nitride, silicon oxide, and silicon oxynitride).

A cell etch-stop pattern 420_b_ may be provided between the bottom electrodes BE and on the cell filling pattern 400_b_. A dielectric layer DL may be provided to cover the bottom electrodes BE and the upper and lower supporting patterns SS1 and SS2. In an embodiment, the dielectric layer DL may be formed of or include at least one of silicon oxide, silicon nitride, silicon oxynitride, or high-k dielectric materials (e.g., hafnium oxide). A top electrode TE may be disposed on the dielectric layer DL to fill a space between the bottom electrodes BE. The top electrode TE may be formed of or include at least one of doped poly-silicon, doped silicon germanium, metal nitride materials (e.g., titanium nitride), or metallic materials (e.g., tungsten, aluminum, and copper). The bottom electrodes BE, the dielectric layer DL, and the top electrode TE may constitute a capacitor CA.

According to an embodiment of the inventive concept, an edge of an upper portion of an active pattern on a peripheral region may have a rounded shape, and thus, a bottom surface of a gate dielectric pattern on the active pattern may have a rounded shape, due to the rounded shape of the edge. As a result, it may be possible to prevent a high electric field from being concentrated on the gate dielectric pattern near the edge and thereby prevent the gate dielectric pattern from undergoing field-induced deteriorated or breakdown. Accordingly, it may be possible to improve the reliability of the semiconductor device.

In addition, even when a seam is formed in a device isolation pattern adjacent to the active pattern, the seam may be formed in a lower portion of the device isolation pattern and may not be exposed to the outside of the device isolation pattern. As a result, it may be possible to reduce process failures (e.g., residues in exposed seams) in a subsequent process and thereby to increase a production yield.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
- a substrate having a peripheral region including peripheral circuits and a cell region including memory integrated circuits;
- a first active pattern protruding from the substrate, in the peripheral region;
- a second active pattern protruding from the substrate, in the cell region; and
- a device isolation pattern being located in the peripheral region and extending adjacent to a sidewall of the first active pattern,
- wherein a first edge of an upper portion of the first active pattern has a rounded shape, and a second edge of an upper portion of the second active pattern has a rounded shape,
- wherein a curvature of the first edge is greater than a curvature of the second edge,
- wherein a top surface of the device isolation pattern is located at a height that is lower than a top surface of the first active pattern, and
- wherein the top surface of the device isolation pattern is concavely recessed toward an inside of the device isolation pattern.

2. The semiconductor device of claim 1, wherein the first active pattern has: (i) a first cross-sectional width at a base thereof, which extends adjacent the substrate, (ii) a second cross-sectional width adjacent the top surface thereof, and (iii) a third cross-sectional width at a midpoint intermediate the substrate and the top surface; and wherein the first cross-sectional width is greater than the third cross-sectional width, which is greater than the second cross-sectional width.

3. The semiconductor device of claim 2, wherein a difference between the third cross-sectional width and the first cross-sectional width is less than a difference between the third cross-sectional width and the second cross-sectional width.

4. The semiconductor device of claim 1, wherein a width of the top surface of the first active pattern is greater than a width of a top surface of the second active pattern.

5. The semiconductor device of claim 1, wherein, as measured at a bottom level of the first active pattern, an angle between a top surface of the substrate and a side surface of the first active pattern is greater than 90°.

6. The semiconductor device of claim 1,
- wherein the device isolation pattern has a seam therein.

7. The semiconductor device of claim 6, wherein a height of a top portion of the seam, as measured relative to the substrate, is less than a height of the device isolation pattern.

8. The semiconductor device of claim 1, further comprising:
- a gate dielectric pattern extended along the top surface of the first active pattern and the top surface of the device isolation pattern,
- wherein a bottom surface of the gate dielectric pattern has a rounded shape that corresponds to the first edge of the upper portion of the first active pattern.

9. The semiconductor device of claim 8, wherein a radius of curvature along the rounded shape of the bottom surface of the gate dielectric pattern corresponds to a radius of curvature along the first edge of the upper portion of the first active pattern.

10. A semiconductor device, comprising:
- a substrate having a peripheral region including peripheral circuits, and a cell region including memory integrated circuits;
- an active pattern protruding from the substrate, within the peripheral region;
- a device isolation pattern provided between the active pattern and an adjacent active pattern; and
- a gate dielectric pattern extended along a top surface of the active pattern and along a top surface of the device isolation pattern,
- wherein an edge of an upper portion of the active pattern has a rounded shape,
- wherein the top surface of the device isolation pattern is located at a height that is lower than the top surface of the active pattern, wherein the top surface of the device isolation pattern is concavely recessed toward an inside of the device isolation pattern, and wherein a bottom surface of the gate dielectric pattern has a rounded shape corresponding to the edge of the upper portion of the active pattern.

11. The semiconductor device of claim 10, wherein, at a bottom level of the active pattern, a first angle between a top surface of the substrate and a side surface of the active pattern is greater than 90°.

12. The semiconductor device of claim 10, wherein the device isolation pattern includes a seam provided therein.

13. The semiconductor device of claim 12, wherein a top portion of the seam is located at a height lower than the top surface of the device isolation pattern.

14. The semiconductor device of claim 10, wherein the gate dielectric pattern has a non-zero curvature at a region adjacent to the edge of the upper portion of the active pattern.

15. A semiconductor device, comprising:

a substrate having a peripheral region including peripheral circuits, and a cell region including memory integrated circuits;

a first active pattern protruding from the substrate, in the peripheral region;

a second active pattern protruding from the substrate, in the cell region; and a device isolation pattern provided between the first active pattern and an adjacent active pattern, wherein a first edge of an upper portion of the first active pattern has a rounded shape, and a second edge of an upper portion of the second active pattern has a rounded shape, wherein the rounded shape of the first edge is convex, and the rounded shape of the second edge is convex, wherein a radius of curvature of the first edge is less than a radius of curvature of the second edge, wherein a top surface of the device isolation pattern is located at a height that is lower than a top surface of the first active pattern, and wherein the top surface of the device isolation pattern is concavely recessed toward an inside of the device isolation pattern.

16. The semiconductor device of claim 15, wherein the first active pattern has: (i) a first cross-sectional width at a base thereof, which extends adjacent the substrate, (ii) a second cross-sectional width adjacent a top surface thereof, and (iii) a third cross-sectional width at a midpoint intermediate the substrate and the top surface, wherein the first cross-sectional width is greater than the third cross-sectional width, which is greater than the second cross-sectional width, and wherein a difference between the third cross-sectional width and the first cross-sectional width is less than a difference between the third cross-sectional width and the second cross-sectional width.

17. The semiconductor device of claim 16, further comprising:

a gate dielectric pattern extended along the top surface of the first active pattern and along a top surface of the device isolation pattern, wherein a bottom surface of the gate dielectric pattern has a rounded shape corresponding to the first edge.

18. The semiconductor device of claim 15, wherein the second edge is more convex than the first edge.

* * * * *